US011758773B2

(12) United States Patent
Lee et al.

(10) Patent No.: US 11,758,773 B2
(45) Date of Patent: Sep. 12, 2023

(54) DISPLAY DEVICE HAVING CRACK PREVENTION PATTERN

(71) Applicant: Samsung Display Co., LTD., Yongin-si (KR)

(72) Inventors: Jin-Yong Lee, Asan-si (KR); Jinho Ju, Seoul (KR); Kwangwoo Park, Hwaseong-si (KR); Minjung Ann, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 43 days.

(21) Appl. No.: 17/319,263

(22) Filed: May 13, 2021

(65) Prior Publication Data

US 2022/0115476 A1 Apr. 14, 2022

(30) Foreign Application Priority Data

Oct. 8, 2020 (KR) .................. 10-2020-0129938

(51) Int. Cl.
*H10K 59/124* (2023.01)
*H10K 50/844* (2023.01)
*H10K 71/00* (2023.01)

(52) U.S. Cl.
CPC ......... *H10K 59/124* (2023.02); *H10K 50/844* (2023.02); *H10K 71/00* (2023.02)

(58) Field of Classification Search
CPC .................................................. H10K 59/124
See application file for complete search history.

(56) References Cited

U.S. PATENT DOCUMENTS

| 7,521,722 | B2 | 4/2009 | Yamazaki et al. | |
| 11,002,888 | B2* | 5/2021 | Ma | G02B 5/201 |
| 2009/0115025 | A1* | 5/2009 | Jung | H01L 23/585 |
| | | | | 257/E23.002 |
| 2013/0323875 | A1* | 12/2013 | Park | H01L 31/022408 |
| | | | | 438/70 |
| 2014/0145177 | A1* | 5/2014 | Lee | H01L 29/78696 |
| | | | | 438/34 |
| 2014/0226255 | A1* | 8/2014 | Chung | H01G 4/012 |
| | | | | 427/79 |

(Continued)

FOREIGN PATENT DOCUMENTS

| KR | 1020200073543 A | 6/2020 |
| KR | 1020200073549 A | 6/2020 |

*Primary Examiner* — Caleb E Henry
(74) *Attorney, Agent, or Firm* — CANTOR COLBURN LLP

(57) ABSTRACT

A display device includes a substrate including a first pixel area, a second pixel area spaced apart from the first pixel area, and a valley area between the first pixel area and the second pixel area, a first insulating layer on the substrate and in both the first pixel area and the second pixel area, a penetration hole through the first insulating layer and corresponding to the valley area, the penetration hole exposing a side surface of the first insulating layer and an upper surface of the substrate to outside the first insulating layer, a crack prevention pattern which is in the penetration hole and covers the side surface of the first insulating layer, and a second insulating layer facing the first insulating layer with the crack prevention pattern therebetween, the second insulating layer in contact with the upper surface of the substrate at the penetration hole.

17 Claims, 7 Drawing Sheets

(56) References Cited

U.S. PATENT DOCUMENTS

| | | | | |
|---|---|---|---|---|
| 2014/0346498 A1* | 11/2014 | Ahn | ................. | H01L 29/66969 |
| | | | | 257/43 |
| 2017/0162822 A1* | 6/2017 | Park | .................... | H01L 51/5246 |
| 2017/0213872 A1* | 7/2017 | Jinbo | .................. | H01L 51/5284 |
| 2018/0070461 A1* | 3/2018 | Lee | ...................... | G09G 3/3225 |
| 2018/0204901 A1* | 7/2018 | Hwang | .............. | H01L 27/3248 |
| 2020/0013834 A1* | 1/2020 | Park | .................... | H01L 27/3246 |
| 2020/0274098 A1* | 8/2020 | Shin | ........................ | H05K 1/18 |
| 2020/0409485 A1* | 12/2020 | Gwon | ................... | G06F 3/0443 |
| 2022/0115476 A1* | 4/2022 | Lee | ..................... | H10K 50/844 |

* cited by examiner

DISPLAY DEVICE HAVING CRACK PREVENTION PATTERN

This application claims priority to Korean Patent Application No. 10-2020-0129938, filed on Oct. 8, 2020, and all the benefits accruing therefrom under 35 U.S.C. § 119, the content of which is hereby incorporated by reference for all purposes as if fully set forth herein.

BACKGROUND

(1) Field

Implementations of the invention relate generally to a display device. More specifically, the invention relates to a display device capable of minimizing damage thereto.

(2) Description of the Related Art

Display devices used in computer monitors, televisions ("TVs"), and mobile phones include organic light emitting displays ("OLEDs") that self-emit light and liquid crystal displays ("LCDs") that use light generated by a separate light source.

When an external force is applied to the display device, cracks may occur in the display device. When cracks occur in a pixel area of the display device or when cracks propagate to the pixel area, a transistor and/or an emission layer disposed in the pixel area may be damaged.

SUMMARY

One or more embodiment provides a display device capable of minimizing damage to a transistor and/or an emission layer in a pixel area.

One or more embodiment provides a method of manufacturing the display device.

A display device includes a substrate including a first pixel area, a second pixel area spaced apart from the first pixel area, and a valley area between the first pixel area and the second pixel area, a first insulating layer on the substrate and in both the first pixel area and the second pixel area, a penetration hole through the first insulating layer and corresponding to the valley area, the penetration hole exposing a side surface of the first insulating layer and an upper surface of the substrate to outside the first insulating layer, a crack prevention pattern which is in the penetration hole and covers the side surface of the first insulating layer, and a second insulating layer facing the first insulating layer with the crack prevention pattern therebetween, the second insulating layer in contact with the upper surface of the substrate at the penetration hole.

According to an embodiment, each of the crack prevention pattern and the first insulating layer has a modulus, and the modulus of the crack prevention pattern may be greater than the modulus of the first insulating layer.

According to an embodiment, the crack prevention pattern may include a metal.

According to an embodiment, the crack prevention pattern may include molybdenum ("Mo").

According to an embodiment, the crack prevention pattern may be electrically floating.

According to an embodiment, at the penetration hole, the first insulating layer may include an upper surface which extends from the side surface and is closest to the second insulating layer, and the crack prevention pattern may be extended outside the penetration hole and along the upper surface of the first insulating layer to be between the first insulating layer and the second insulating layer.

According to an embodiment, the first insulating layer may include a first inorganic insulating layer, a second inorganic insulating layer and a third inorganic insulating layer in order toward the second insulating layer, the display device may further include in the first pixel area, a transistor and a display element which is connected to the transistor, an active pattern of the transistor which is between the substrate and the first inorganic insulating layer, a plurality of gate electrodes of the transistor which is between the first inorganic insulating layer and the second inorganic insulating layer and corresponding to the active pattern, and a connection electrode which connects the transistor to the display element and is between the third inorganic layer and the second insulating layer, and where the crack prevention pattern and the connection electrode may be respective patterns of a same material layer on the substrate.

According to an embodiment, the display device may further include a connection pattern which connects the first pixel area to the second pixel area, the connection pattern may face the first insulating layer with the second insulating layer therebetween, may extend across the valley area, and may be electrically connected to the first pixel area at any one of the plurality of gate electrodes thereof.

According to an embodiment, the substrate may include in order toward the first insulating layer, an organic layer, a barrier layer and a buffer layer, where the penetration hole may extend into the buffer layer of the substrate.

A display device includes a substrate including a plurality of pixel areas arranged in a matrix form and a valley area which surrounds each of the pixel areas, a first insulating layer on the substrate and in each of the pixel areas, a penetration hole through the first insulating layer and corresponding to the valley area, the penetration hole exposing a side surface of the first insulating layer and an upper surface of the substrate to outside the first insulating layer, a crack prevention pattern which is in the penetration hole and covers the side surface of the first insulating layer, and a second insulating layer facing the first insulating layer with the crack prevention pattern therebetween, the second insulating layer contacting the upper surface of the substrate at the penetration hole.

According to an embodiment, each of the crack prevention pattern and the first insulating layer has a modulus, and the modulus of the crack prevention pattern may be greater than the modulus of the first insulating layer.

According to an embodiment, the crack prevention pattern may include a metal.

According to an embodiment, the crack prevention pattern may include molybdenum ("Mo").

According to an embodiment, the crack prevention pattern may be electrically floating.

According to an embodiment, at the penetration hole, the first insulating layer may include an upper surface which extends from the side surface and is closest to the second insulating layer, and the crack prevention pattern may be extend outside the penetration hole and along the upper surface of the first insulating layer to be between the first insulating layer and the second insulating layer.

According to an embodiment, the first insulating layer may include in order toward the second insulating layer, a first inorganic insulating layer, a second inorganic insulating layer and a third inorganic insulating layer, the display device may further include in a pixel area of the pixel areas, a transistor and a display element which is connected to the transistor, an active pattern of the transistor which is between the substrate and the first inorganic insulating layer, a plurality of gate electrodes of the transistor which is between the first inorganic insulating layer and the second inorganic insulating layer and corresponding to the active pattern, and a connection electrode which connects the transistor to the display element and is between the third inorganic insulating layer and the second insulating layer, and where the crack prevention pattern and the connection electrode may be respective patterns of a same material layer on the substrate.

According to an embodiment, the display device may further include a connection pattern which electrically connects the pixel areas adjacent to each other, the connection pattern may face the first insulating layer with the second insulating layer therebetween, may extend across the valley area, and may be electrically connected to the pixel area at any one of the plurality of gate electrodes thereof.

According to an embodiment, the substrate may include in order toward the first insulating layer, an organic layer, a barrier layer and a buffer layer, where the penetration hole may extend into the buffer layer of the substrate.

A method of manufacturing a display device includes forming a substrate including a first pixel area, a second pixel area spaced apart from the first pixel area, and a valley area between the first pixel area and the second pixel area, forming a first insulating layer in both the first pixel area and the second pixel area and, forming a penetration hole through the first insulating layer and corresponding to the valley area, the penetration hole exposing a side surface of the first insulating layer and an upper surface of the substrate to outside the first insulating layer, forming a crack prevention pattern inside the penetration hole and covering the side surface of the first insulating layer, and forming a second insulating layer facing the first insulating layer with the crack prevention pattern therebetween, the second insulating layer in contact with the upper surface of the substrate at the penetration hole.

According to an embodiment, the method of manufacturing the display device may further include forming in both the first pixel area and the second pixel area, a transistor and a display element which is connected to the transistor, the forming the crack prevention pattern may include forming a connection electrode which connects the transistor to the display element.

Therefore, one or more embodiment of the display device includes a substrate including a first pixel area, a second pixel area spaced apart from the first pixel area, and a valley area between the first pixel area and the second pixel area, a first insulating layer on the substrate and in both the first pixel area and the second pixel area, a penetration hole through the first insulating layer and corresponding to the valley area, the penetration hole exposing a side surface of the first insulating layer and an upper surface of the substrate to outside the first insulating layer, a crack prevention pattern which is in the penetration hole and covers the side surface of the first insulating layer, and a second insulating layer facing the first insulating layer with the crack prevention pattern therebetween, the second insulating layer in contact with the upper surface of the substrate at the penetration hole.

As the crack prevention pattern covers the side surface of the first insulating layer in the valley area, the crack prevention pattern may reduce or effectively prevent cracks from propagating to the first and second pixel areas. Accordingly, damage to the transistor and/or the emission layer in the first and second pixel areas can be minimized.

In addition, in the method of manufacturing the display device, forming the crack prevention pattern may include forming the connection electrode which connects the transistor to the display element. In other words, the forming of the crack prevention pattern may be performed simultaneously with the forming of the connection electrode, and the crack prevention pattern may be made of or include the same material as the connection electrode. Accordingly, the method of manufacturing the display device does omits an additional mask to pattern the crack prevention pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
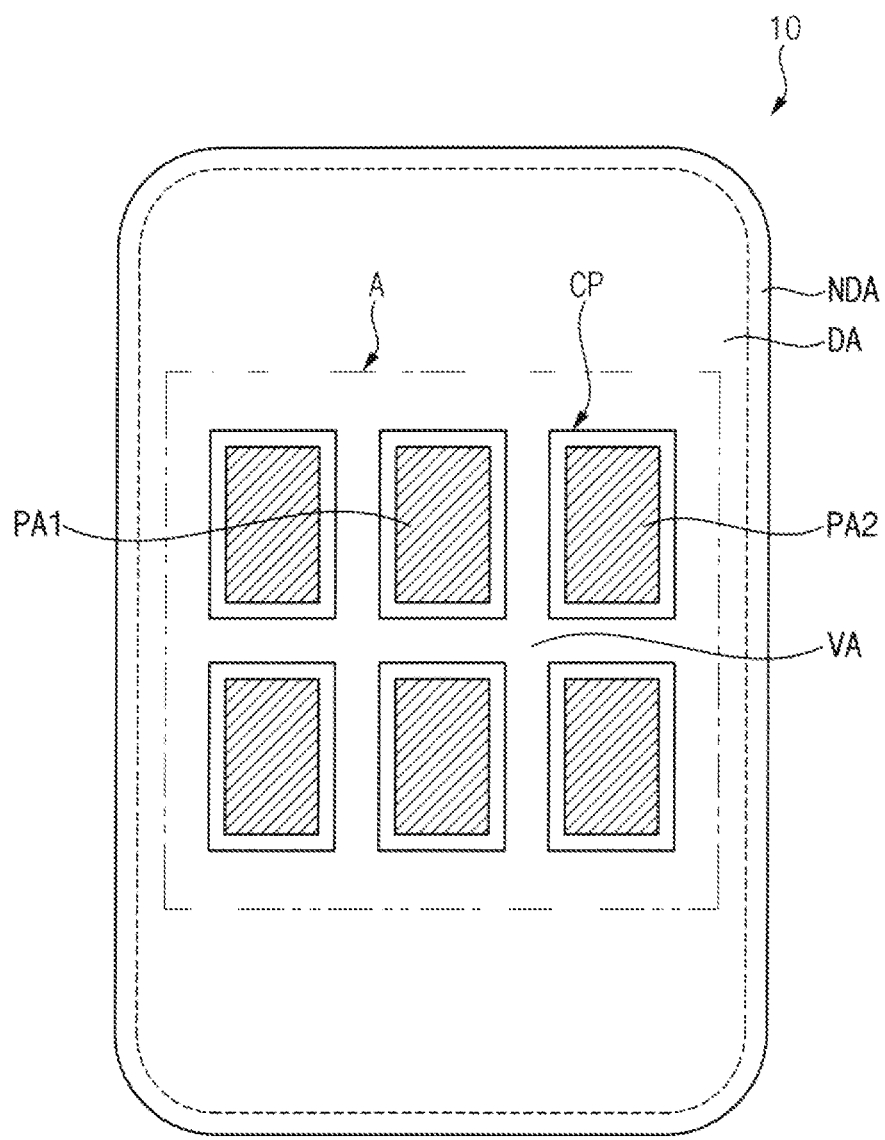
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
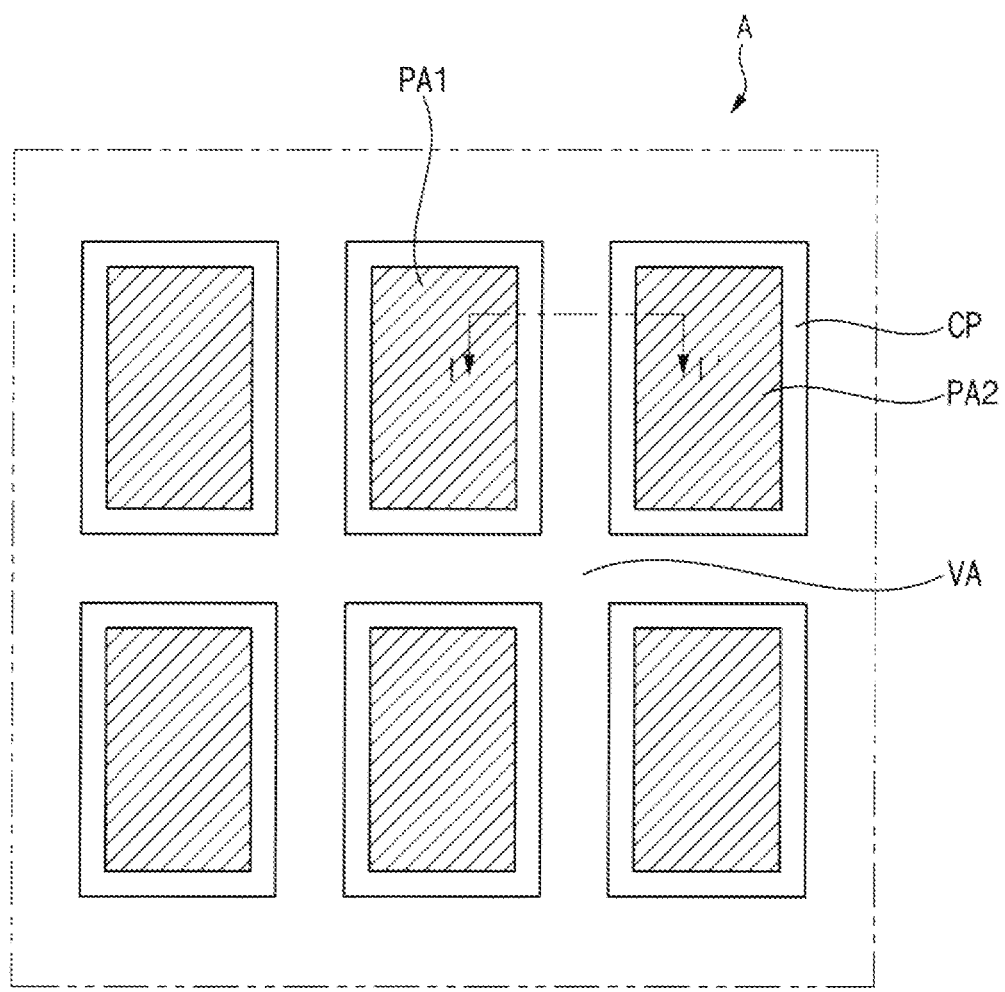
FIG. 2 is an enlarged plan view of area A of FIG. 1.
Figure 3:
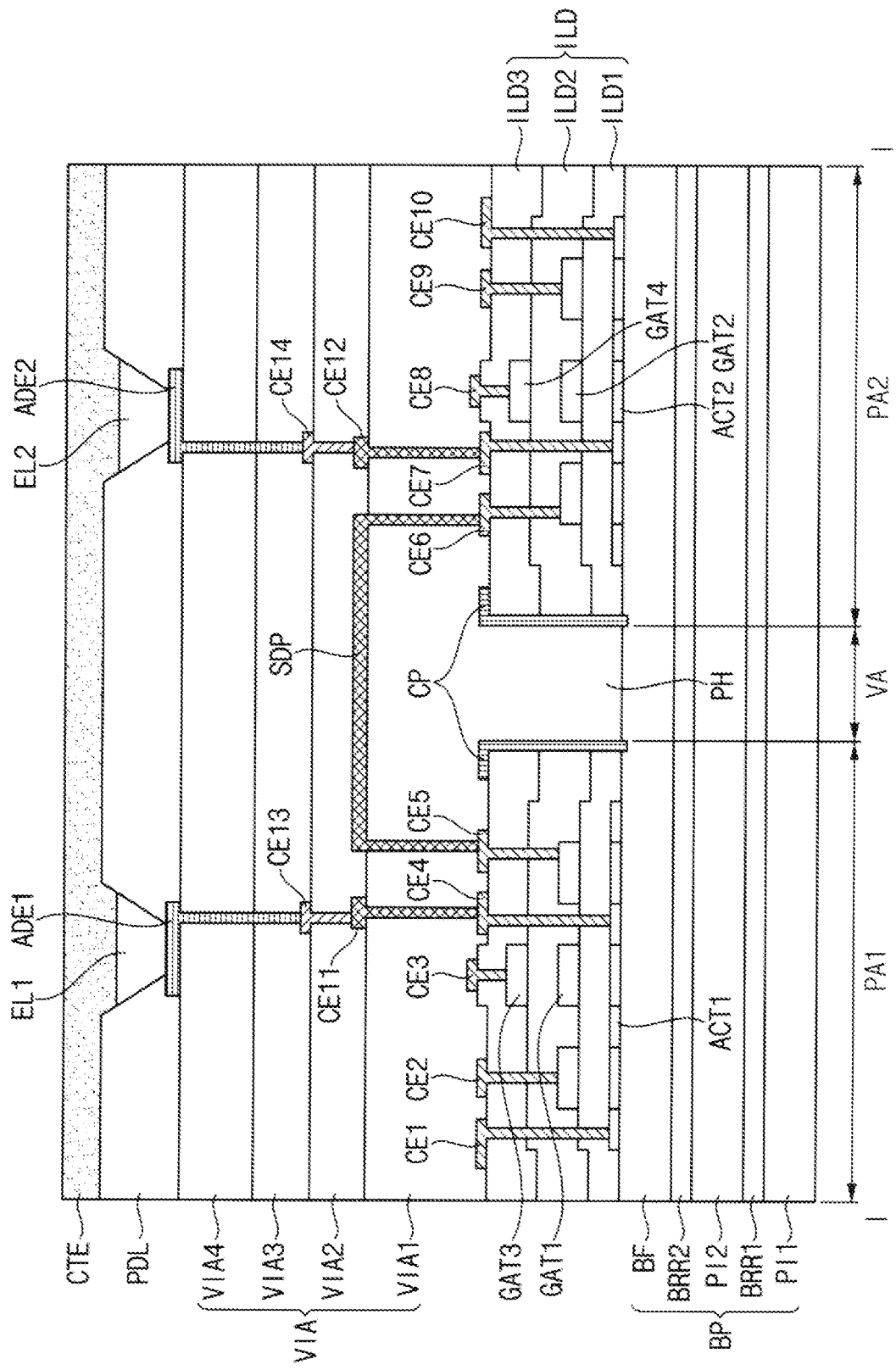
FIG. 3 is a cross-sectional view taken along line I-I' of FIG. 2.

FIG. 1 is a plan view illustrating an embodiment of a display device 10. FIG. 2 is an enlarged plan view of area A of FIG. 1. FIG. 3 is a cross-sectional view taken along line I-I' of FIG. 2.

Referring to FIGS. 1 and 2, a display device 10 may be divided into a display area DA and a non-display area NDA which is adjacent to the display area DA. The display area DA may include a plurality of pixel areas, and an image may be displayed in the display area DA. Drivers (e.g. a gate driver and/or a data driver) may be disposed in the non-display area NDA. In an embodiment, the non-display area NDA may be disposed to surround the display area DA on a plane (e.g., in a plan view).

In an embodiment, the display area DA may include a first pixel area PA1, a second pixel area PA2 and a valley area VA (e.g., non-pixel area). In an embodiment, for example, the display area DA may include the first pixel area PA1, the second pixel area PA2 spaced apart from the first pixel area PA1, and the valley area VA disposed between the first pixel area PA1 and the second pixel area PA2. Referring to FIGS. 1 and 2, for example, a plurality of pixel areas are arranged in a matrix form (e.g., along the first and second directions) and the valley area VA may be surrounding each of the pixel areas.

The first pixel area PA1 and the second pixel area PA2 may be spaced apart along a first direction (e.g., horizontal in FIGS. 1 and 2). Pixel areas may be spaced apart from each other along a second direction (e.g., vertical in FIGS. 1 and 2) which crosses the first direction. The valley area VA may be between pixel areas adjacent to each other along the second direction, in the plan view. A third direction (e.g., into the view of FIGS. 1 and 2 or vertical in FIG. 3) may define a thickness direction of the display device 10 and various components or layers thereof.

Referring to FIG. 3, the display device 10 may include a substrate BP, a first insulating layer ILD, a second insulating layer VIA, a pixel defining layer PDL, a first emission layer EL1 and a second emission layer EL2 which are disposed in the display area DA.

The substrate BP may include a first organic layer PI1, a first barrier layer BRR1 disposed on the first organic layer PI1, a second organic layer PI2 disposed on the barrier layer BRR1, a second barrier layer BRR2 disposed on the second organic layer PI2, and a buffer layer BF disposed on the second barrier layer BRR2. In an embodiment, for example, the substrate BP may include a single layer or multiple layers. The first organic layer PI1, the first barrier layer BRR1, the second organic layer PI2, the second barrier layer BRR2 and the buffer layer BF may be in order toward the first insulating layer ILD.

The first insulating layer ILD may be disposed on the buffer layer BF. In an embodiment, the first insulating layer ILD may include a first inorganic insulating layer ILD1, a second inorganic insulating layer ILD2 disposed on the first inorganic insulating layer ILD1, and a third inorganic insulating layer ILD3 disposed on the second inorganic insulating layer ILD2. That is, the first insulating layer ILD includes the first inorganic insulating layer ILD1, the second inorganic insulating layer ILD2 and the third inorganic insulating layer ILD3 in order toward the second insulating layer VIA. The first insulating layer ILD may include an inorganic insulating material. In an embodiment, for example, the first insulating layer ILD may include silicon nitride ("$SiN_x$"), silicon oxide ("$SiO_x$") or the like.

The second insulating layer VIA may be disposed on the first insulating layer ILD. In an embodiment, the second insulating layer VIA may include a first organic insulating layer VIA1, a second organic insulating layer VIA2 disposed on the first organic insulating layer VIA1, a third organic insulating layer VIA3 disposed on the second organic insulating layer VIA2, and a fourth organic insulating layer VIA4 disposed on the third organic insulating layer VIA3. The second insulating layer VIA may include an organic insulating material. The first organic insulating layer VIA1 may contact the substrate BP in the valley area VA at or through a penetration hole PH penetrating the first insulating layer ILD.

The first insulating layer ILD may be disconnected at the valley area VA by the penetration hole PH. The penetration hole PH may expose a side surface of the first insulating layer ILD to outside thereof. The penetration hole PH may expose an upper surface of the substrate BP to outside the first insulating layer ILD. The penetration hole PH may further penetrate into the buffer layer BF disposed at the upper surface of the substrate BP which is closest to the first insulating layer ILD. The first insulating layer ILD which is penetrated by the penetration hole PH may define a stepped structure relative to the substrate BP and the stepped structure may define the valley area VA without being limited thereto.

A first active pattern ACT1 and a second active pattern ACT2 may each be disposed between the substrate BP and the first inorganic insulating layer ILD1. In an embodiment, the first active pattern ACT1 may overlap or correspond to the first pixel area PA1 and the second active pattern ACT2 may overlap or correspond to the second pixel area PA2. The first and second active patterns ACT1 and ACT2 may include a silicon semiconductor and/or an oxide semiconductor.

A first gate electrode GAT1 may be provided in plural including a plurality of first gate electrodes GAT1 each disposed between the first inorganic insulating layer ILD1 and the second inorganic insulating layer ILD2. The plurality of first gate electrodes GAT1 may overlap or correspond to a single one of the first active pattern ACT1. A second gate electrode GAT2 may be provided in plural including a plurality of second gate electrodes GAT2 disposed between the first inorganic insulating layer ILD1 and the second inorganic insulating layer ILD2. The plurality of second gate electrodes GAT2 may overlap or correspond to a single one of the second active pattern ACT2.

A third gate electrode GAT3 may be disposed between the second inorganic insulating layer ILD2 and the third inorganic insulating layer ILD3 and may overlap or correspond to the first active pattern ACT1. The third gate electrode GAT3 may correspond to a same one of the first active pattern ACT1 to which the plurality of first gate electrodes GAT1 corresponds. A fourth gate electrode GAT4 may be disposed between the second inorganic insulating layer ILD2 and the third inorganic insulating layer ILD3 and may overlap or correspond to the second active pattern ACT2. The fourth gate electrode GAT4 may correspond to a same one of the second active pattern ACT2 to which the plurality of second gate electrodes GAT2 corresponds.

At least one connection electrode capable of transmitting a driving signal to the first or second gate electrodes GAT1 and GAT2 may be disposed on the third inorganic insulating layer ILD3. In an embodiment, for example, the connection electrode may include first to tenth connection electrodes CE1, CE2, CE3, CE4, CE5, CE6, CE7, CE8, CE9 and CE10. The first and fourth connection electrodes CE1 and CE4 may contact the first active pattern ACT1, and the seventh and tenth connection electrodes CE7 and CE10 may contact the second active pattern ACT2. The second and fifth connection electrodes CE2 and CE5 may contact the first gate electrodes GAT1, and the sixth and ninth connection electrodes CE6 and CE9 may contact the second gate electrodes GAT2.

The display device 10 may include a connection pattern SDP disposed on the second insulating layer VIA, overlapping the valley area VA, and electrically connected to any one of the first gate electrodes GAT1. The connection pattern SDP may electrically connect the fifth connection electrode CE5 overlapping the first pixel area PA1 to the sixth connection electrode CE6 overlapping the second pixel area PA2. That is, the connection pattern SDP electrically connects pixel areas and/or transistors of different pixel areas to each other. Referring to FIG. 3, the display device 10 includes the connection pattern SDP which connects the first pixel area PA1 to the second pixel area PA2. In an embodiment, the connection pattern SDP faces the first insulating layer ILD with the second insulating layer VIA therebetween, extends across the valley area VA, and is electrically connected to the first pixel area PA1 at any one of the plurality of gate electrodes thereof.

The first active pattern ACT1, the first gate electrodes GAT1, the third gate electrode GAT3, and the first to fifth connection electrodes CE1, CE2, CE3, CE4, and CE5 may constitute a first transistor disposed in the first pixel area PA1. The second active pattern ACT2, the second gate electrodes GAT2, the fourth gate electrode GAT4, and the sixth to tenth connection electrodes CE6, CE7, CE8, CE9, and CE10 may constitute a second transistor disposed in the second pixel area PA2.

An eleventh connection electrode CE11 through which a driving signal is transmitted from the fourth connection electrode CE4 may be disposed on the first organic insulating layer VIA1 and a twelfth connection electrode CE12 through which a driving signal is transmitted from the seventh connection electrode CE7 may be disposed on the first organic insulating layer VIA1.

A thirteenth connection electrode CE13 through which a driving signal is transmitted from the eleventh connection electrode CE11 may be disposed on the second organic insulating layer VIA2 and a fourteenth connection electrode CE14 through which a driving signal is transmitted from the twelfth connection electrode CE12 may be disposed on the second organic insulating layer VIA2.

A first lower electrode ADE1 may be disposed on the fourth organic insulating layer VIA4. The first lower electrode ADE1 may overlap the first pixel area PA1 and may contact the thirteenth connection electrode CE13. A second lower electrode ADE2 may be disposed on the fourth organic insulating layer VIA4. The second lower electrode ADE2 may overlap the second pixel area PA2 and may contact the fourteenth connection electrode CE14.

The pixel defining layer PDL may be disposed on the fourth organic insulating layer VIA4. A first opening and a second opening which expose the first lower electrode ADE1 and the second lower electrode ADE2 to outside the pixel defining layer PDL, respectively, may be provided or formed in the pixel defining layer PDL.

The first emission layer EL1 may be disposed on the first lower electrode ADE1. In addition, the first emission layer EL1 may be disposed inside the first opening defined by portions of the pixel defining layer PDL. The first emission layer EL1 may include an organic emission material, and may emit light having a color according to the organic emission material.

The second emission layer EL2 may be disposed on the second lower electrode ADE2. In addition, the second emission layer EL2 may be disposed inside the second opening defined by portions of the pixel defining layer PDL. The second emission layer EL2 may include an organic emission material, and may emit light having a color according to the organic emission material.

An upper electrode CTE may be disposed on the pixel defining layer PDL. A lower electrode, an emission layer and the upper electrode CTE may together define a display element of the display device 10 which generates or emits light, displays an image, etc., without being limited thereto.

The display element (or the emission layer) may correspond to an emission area of the pixel area while the valley area VA may correspond to a non-emission area of the pixel area, without being limited thereto. A pixel area may include a transistor and a display element which is connected to the transistor.

In a conventional display device, when an external force is applied to the conventional display device, a crack may occur inside the conventional display device. When the crack occurs in a conventional pixel area of the conventional display device or the crack propagates to the conventional pixel area of the conventional display device, a transistor and/or an emission layer of a conventional display element disposed in the conventional pixel area may be damaged.

However, in one or more embodiment of the display device 10, the penetration hole PH penetrating the first insulating layer ILD in the valley area VA may be provided or formed. Accordingly, the external force applied to the display device 10 may be not evenly distributed, and the external force may be concentrated to the valley area VA through the penetration hole PH. With this structure, the first and second pixel areas PA1 and PA2 may be protected by the valley area VA disposed between the first and second pixel areas PA1 and PA2.

To further protect the first and second pixel areas PA1 and PA2 from the external force concentrated in the penetration hole PH which may spread to the first and second pixel areas PA1 and PA2 and propagate a crack to the first and second pixel areas PA1 and PA2, a crack prevention pattern CP may overlap the valley area VA and may be disposed between the first insulating layer ILD and the second insulating layer VIA. The first insulating layer ILD may include a side surface which defines the penetration hole PH together with the upper surface of the substrate BP. The crack prevention pattern CP may extend along and cover the side surface of the first insulating layer ILD exposed to outside thereof by the penetration hole PH.

The first insulating layer ILD includes an upper surface which extends from the side surface thereof and is closest to the second insulating layer VIA. The crack prevention pattern CP may extend from the side surface of the first insulating layer ILD to extend along the upper surface of the first insulating layer ILD. The crack prevention pattern CP is extended outside the penetration hole PH and along the upper surface of the first insulating layer ILD to be between the first insulating layer ILD and the second insulating layer VIA. The second insulating layer VIA may be facing the first insulating layer ILD with the crack prevention pattern CP therebetween, where the second insulating layer VIA is in contact with the upper surface of the substrate BP at the penetration hole PH. As being in contact, elements may form an interface therebetween.

A modulus of the crack prevention pattern CP may be greater than a modulus of the first insulating layer ILD. Accordingly, the crack prevention pattern CP may reduce or effectively prevent the external force concentrated in the penetration hole PH from spreading to the first and second pixel areas PA1 and PA2. Therefore, the crack prevention pattern CP may minimize damage from the crack to the first and second transistors and/or the first and second emission layers EL1 and EL2 disposed in the first and second pixel areas PA1 and PA2.

The crack prevention pattern CP may include a metal. In detail, the crack prevention pattern CP may include molybdenum (Mo). The crack prevention pattern CP may be electrically floating.

In addition, the crack prevention pattern CP is not limited to a metal, and may include any one of silicon nitride ("$SiN_x$"), silicon oxide ("$SiO_x$"), and silicon oxynitride ("SiON").

FIGS. 4 to 7 are cross-sectional views illustrating an embodiment of a method of providing or manufacturing a display device 10.

Figure 4:
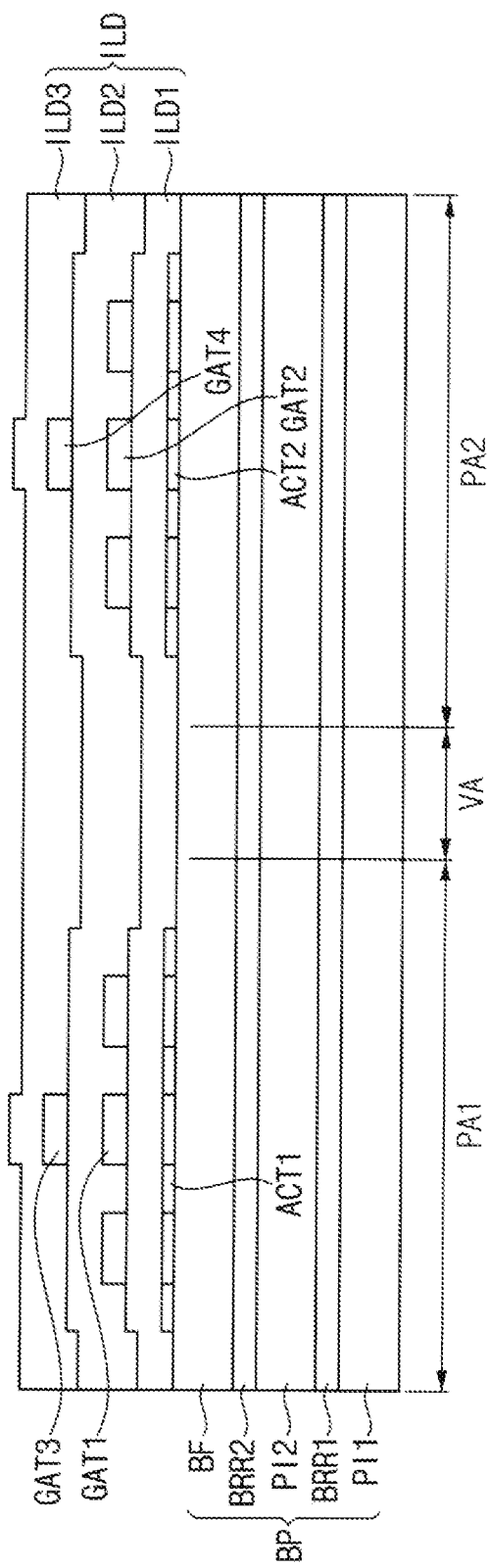
FIGS. 4 to 7 are cross-sectional view illustrating an embodiment of a method of manufacturing a display device.

Referring to FIG. 4, a method of providing or manufacturing the display device 10 may include providing or forming the substrate BP, providing or forming the first and second active patterns ACT1 and ACT2, providing or forming the first inorganic insulating layer ILD1, providing or forming the first and second gate electrodes GAT1 and GAT2, providing or forming the second inorganic insulating layer ILD2, providing or forming the third and fourth gate electrodes GAT3 and GAT4, and providing or forming the third inorganic insulating layer ILD3.

The first active pattern ACT1 and the second active pattern ACT2 may be in a same layer as each other, the first and second gate electrodes GAT1 and GAT2 may be in a same layer as each other and the third and fourth gate electrodes GAT3 and GAT4 may be in a same layer as each other, without being limited thereto. As being in a same layer, elements may be respective patterns of a same material layer on the substrate BP.

In an embodiment, the forming the substrate BP may include providing or forming the first organic layer PI1, providing or forming the first barrier layer BRR1, providing or forming the second organic layer PI2, providing or forming the second barrier layer BRR2, and providing or forming the buffer layer BF.

Figure 5:
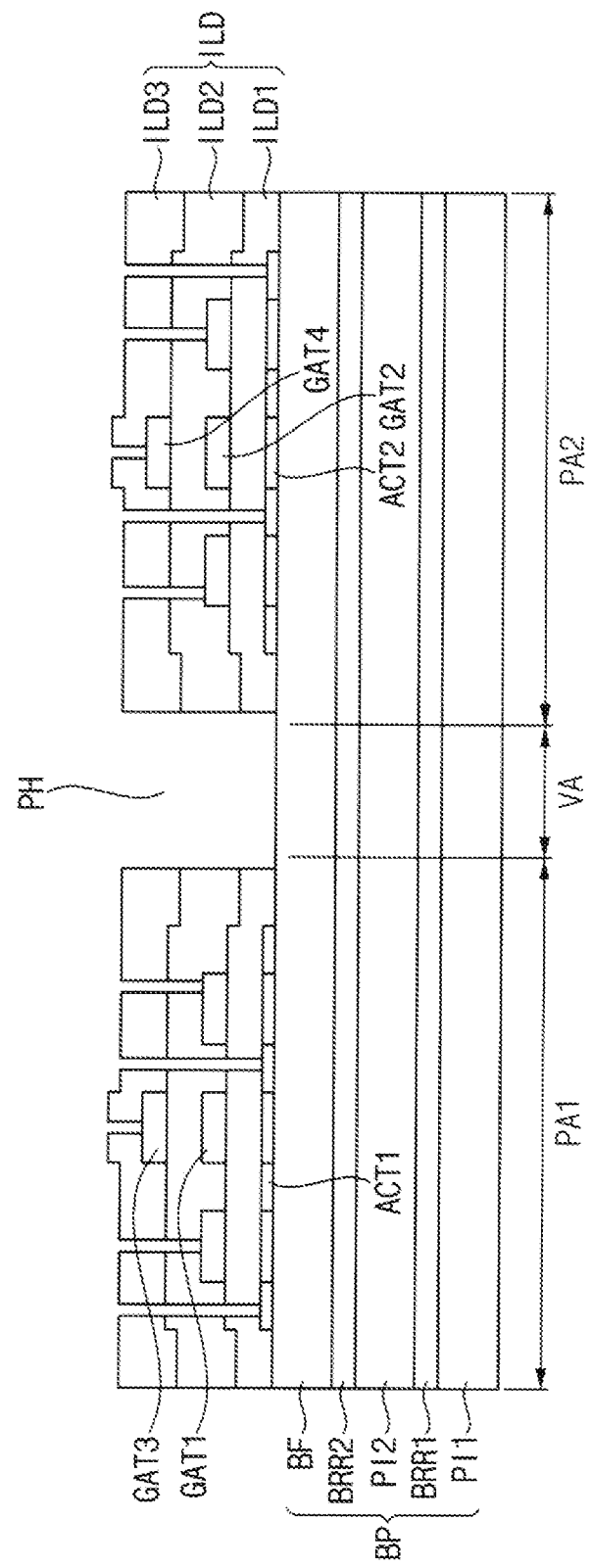

Referring to FIG. 5, the method of providing or manufacturing the display device 10 may include providing or forming a penetration hole PH at the valley area VA and penetrating the first to third inorganic insulating layers ILD1, ILD2, and ILD3, after the providing or forming of the third inorganic insulating layer ILD3. In an embodiment, for example, the forming of the penetration hole PH may include forming contact holes exposing any one of the first active pattern ACT1, the second active pattern ACT2, the first gate electrode GAT1, the second gate electrode GAT2, the third gate electrode GAT3, and the fourth gate electrode GAT4 to outside the first insulating layer ILD.

Figure 6:
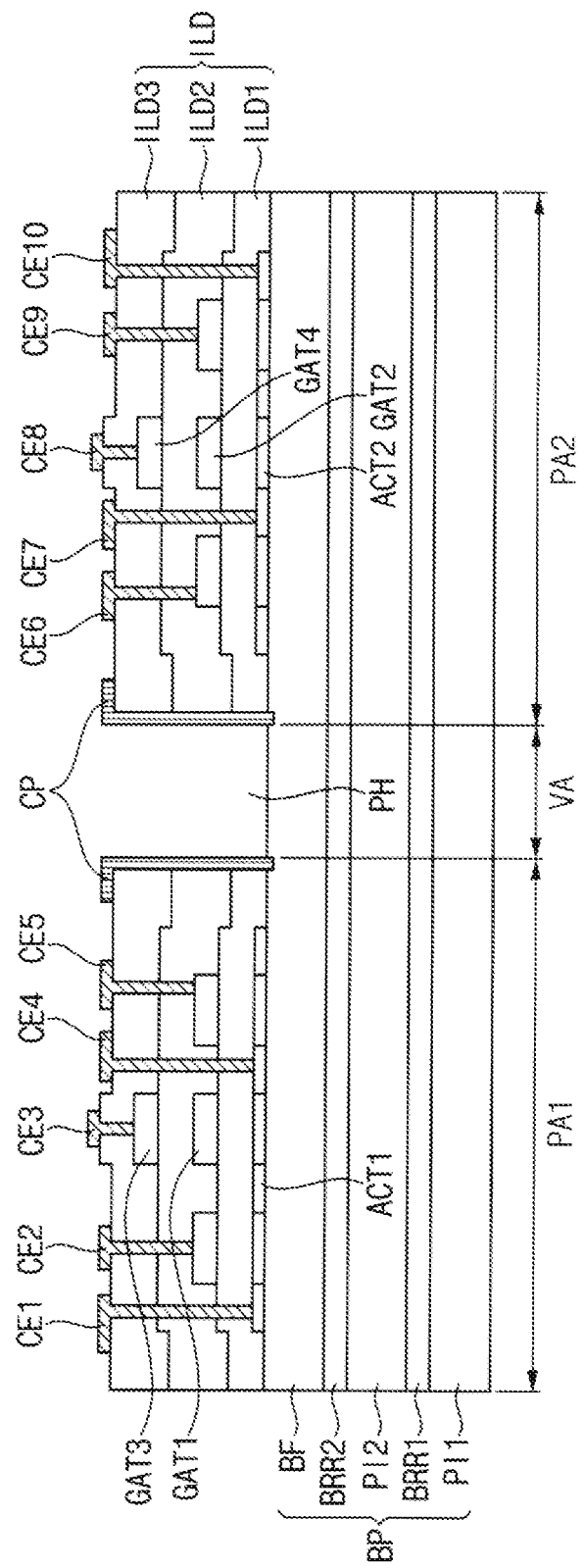

Referring to FIG. 6, the method of providing or manufacturing the display device 10 may include providing or forming the crack prevention pattern CP inside of the penetration hole PH, after the forming the penetration hole PH. In an embodiment, for example, the forming of the crack prevention pattern CP may include forming the first to tenth connection electrodes CE1, CE2, CE3, CE4, CE5, CE6, CE7, CE8, CE9, and CE10 in respective contact holes. In an embodiment, for example, the providing or forming of the crack prevention pattern CP and the providing or forming of the first to tenth connection electrodes CE1, CE2, CE3, CE4, CE5, CE6, CE7, CE8, CE9, and CE10 may be performed at the same time. The crack prevention pattern CP may include the same material as the first to tenth connection electrodes CE1, CE2, CE3, CE4, CE5, CE6, CE7, CE8, CE9, and CE10. In an embodiment, the crack prevention pattern CP and the first to tenth connection electrodes CE1, CE2, CE3, CE4, CE5, CE6, CE7, CE8, CE9, and CE10 may be respective patterns of a same material layer on the substrate BP, without being limited thereto. Accordingly, the method of providing or manufacturing the display device 10 may exclude an additional mask to pattern the crack prevention pattern CP.

Figure 7:
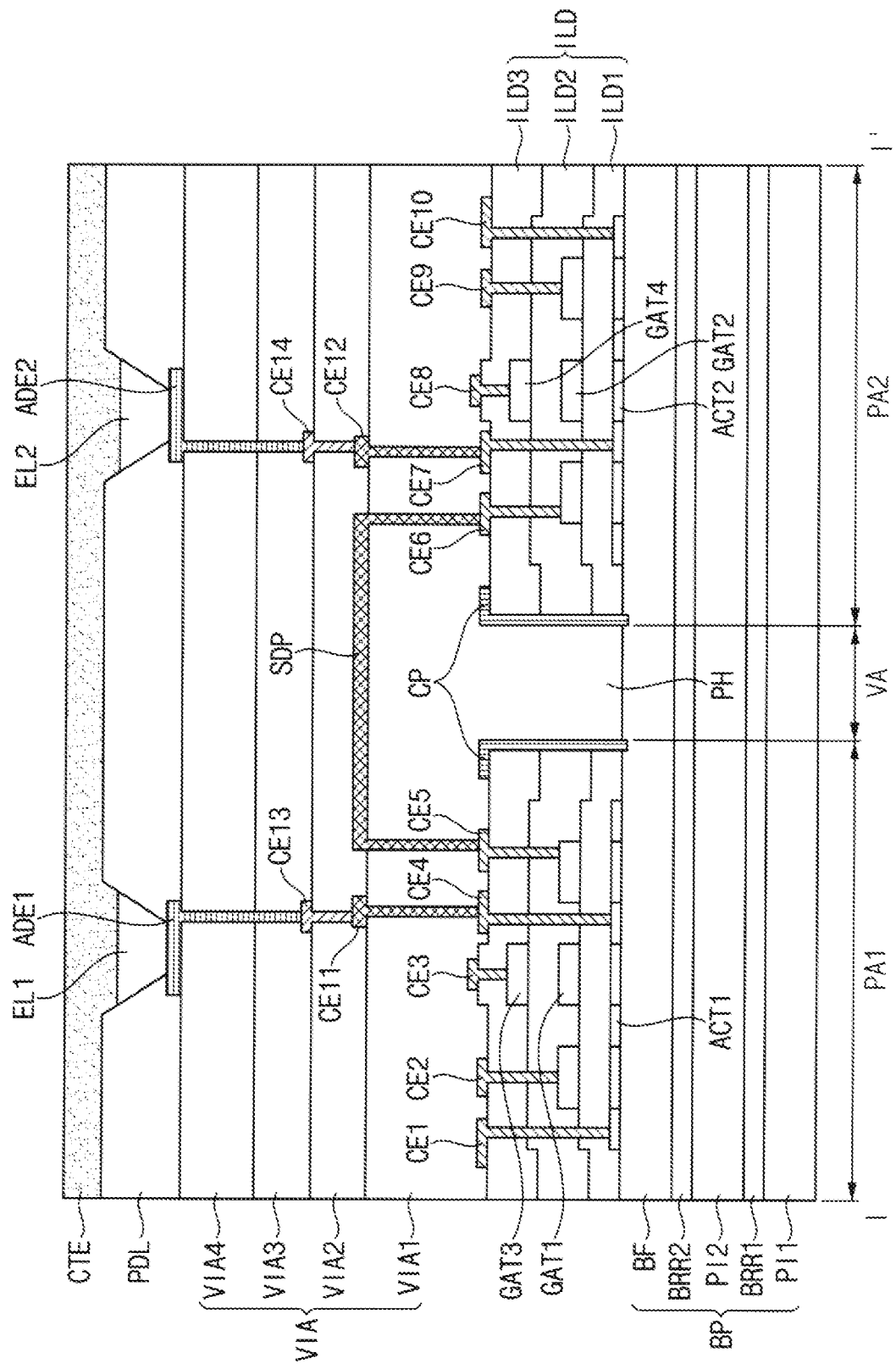

Referring to FIG. 7, the method of providing or manufacturing the display device 10 may include providing or forming the first organic insulating layer VIA1, providing or forming the eleventh and twelfth connection electrodes CE11 and CE12, providing or forming the connection pattern SDP, providing or forming the second organic insulating layer VIA2, providing or forming the thirteenth and fourteenth connection electrodes CE13 and CE14, providing or forming the third organic insulating layer VIA3, providing or forming the fourth organic insulating layer VIA4, providing or forming the first and second lower electrodes ADE1 and ADE2, providing or forming the pixel defining layer PDL, providing or forming the first and second emission layers EL1 and EL2, and providing or forming the upper electrode CTE, after the forming the crack prevention pattern CP.

In an embodiment, for example, the providing or forming of the eleventh and twelfth connection electrodes CE11 and CE12 and the providing or forming of the connection pattern SDP may be performed at the same time. The eleventh and twelfth connection electrodes CE11 and CE12 may include the same material as the connection pattern SDP. In an embodiment, the connection pattern SDP and the eleventh and twelfth connection electrodes CE11 and CE12 may be respective patterns of a same material layer on the substrate BP, without being limited thereto.

More than one of the connection electrodes CE1, CE2, CE3, CE4, CE5, CE6, CE7, CE8, CE9, and CE10 taken together may otherwise define a connection electrode. More than one of the inorganic layers taken together may otherwise define an inorganic layer. One or more of the organic layers taken together may otherwise define an organic layer. More than one of the first active pattern ACT1 and the second active pattern ACT2 taken together may define an active pattern or active pattern layer.

Although certain embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a substrate including a first pixel area, a second pixel area spaced apart from the first pixel area, and a valley area between the first pixel area and the second pixel area;
   a first insulating layer on the substrate and in both the first pixel area and the second pixel area;
   a penetration hole through the first insulating layer and corresponding to the valley area, the penetration hole exposing a side surface of the first insulating layer and an upper surface of the substrate to outside the first insulating layer;
   a crack prevention pattern which is in the penetration hole and covers the side surface of the first insulating layer, the crack prevention pattern which covers the side surface of the first insulating layer being electrically floating; and
   a second insulating layer facing the first insulating layer with the crack prevention pattern therebetween, the second insulating layer in contact with the upper surface of the substrate at the penetration hole.

2. The display device of claim 1, wherein
   each of the crack prevention pattern and the first insulating layer has a modulus, and
   the modulus of the crack prevention pattern is greater than the modulus of the first insulating layer.

3. The display device of claim 1, wherein the crack prevention pattern includes a metal.

4. The display device of claim 3, wherein the crack prevention pattern includes molybdenum.

5. The display device of claim 1, wherein at the penetration hole:
   the first insulating layer includes an upper surface which extends from the side surface and is closest to the second insulating layer, and
   the crack prevention pattern is extended outside the penetration hole and along the upper surface of the first insulating layer to be between the first insulating layer and the second insulating layer.

6. The display device of claim 1, wherein
   the first insulating layer includes a first inorganic insulating layer, a second inorganic insulating layer and a third inorganic insulating layer in order toward the second insulating layer,
   further comprising in the first pixel area:
   a transistor and a display element which is connected to the transistor;
   an active pattern of the transistor which is between the substrate and the first inorganic insulating layer;
   a plurality of gate electrodes of the transistor which is between the first inorganic insulating layer and the second inorganic insulating layer and corresponding to the active pattern; and
   a connection electrode which connects the transistor to the display element and is between the third inorganic insulating layer and the second insulating layer, and
   wherein the crack prevention pattern and the connection electrode are respective patterns of a same material layer on the substrate.

7. The display device of claim 6, further comprising a connection pattern which connects the first pixel area to the second pixel area,
   wherein the connection pattern faces the first insulating layer with the second insulating layer therebetween, extends across the valley area, and is electrically connected to the first pixel area at any one of the plurality of gate electrodes thereof.

8. The display device of claim 1, wherein the substrate comprises in order toward the first insulating layer, an organic layer, a barrier layer and a buffer layer,
   wherein the penetration hole extends into the buffer layer of the substrate.

9. A display device comprising:
   a substrate including a plurality of pixel areas arranged in a matrix form and a valley area which surrounds each of the pixel areas;
   a first insulating layer on the substrate and in each of the pixel areas;
   a penetration hole through the first insulating layer and corresponding to the valley area, the penetration hole exposing a side surface of the first insulating layer and an upper surface of the substrate to outside the first insulating layer;
   a crack prevention pattern which is in the penetration hole and covers the side surface of the first insulating layer; and
   a second insulating layer facing the first insulating layer with the crack prevention pattern therebetween, the second insulating layer contacting the upper surface of the substrate at the penetration hole.

10. The display device of claim 9, wherein
each of the crack prevention pattern and the first insulating layer has a modulus, and
the modulus of the crack prevention pattern is greater than the modulus of the first insulating layer.

11. The display device of claim 9, wherein the crack prevention pattern includes a metal.

12. The display device of claim 11, wherein the crack prevention pattern includes molybdenum.

13. The display device of claim 11, wherein the crack prevention pattern is electrically floating.

14. The display device of claim 9, wherein at the penetration hole:
the first insulating layer includes an upper surface which extends from the side surface and is closest to the second insulating layer, and
the crack prevention pattern is extended outside the penetration hole and along the upper surface of the first insulating layer to be between the first insulating layer and the second insulating layer.

15. The display device of claim 9, wherein
the first insulating layer includes in order toward the second insulating layer, a first inorganic insulating layer, a second inorganic insulating layer and a third inorganic insulating layer,
further comprising in a pixel area of the pixel areas:
a transistor and a display element which is connected to the transistor;
an active pattern of the transistor which is between the substrate and the first inorganic insulating layer;
a plurality of gate electrodes of the transistor which is between the first inorganic insulating layer and the second inorganic insulating layer and corresponding to the active pattern; and
a connection electrode which connects the transistor to the display element and is between the third inorganic insulating layer and the second insulating layer, and
wherein the crack prevention pattern and the connection electrode are respective patterns of a same material layer on the substrate.

16. The display device of claim 15, further comprising a connection pattern which electrically connects the pixel areas adjacent to each other,
wherein the connection pattern faces the first insulating layer with the second insulating layer therebetween, extends across the valley area, and is electrically connected to the pixel area at any one of the plurality of gate electrodes thereof.

17. The display device of claim 9, wherein the substrate comprises in order toward the first insulating layer, an organic layer, a barrier layer and a buffer layer,
wherein the penetration hole extends into the buffer layer of the substrate.

* * * * *